United States Patent
Cai et al.

(10) Patent No.: US 10,043,710 B2
(45) Date of Patent: Aug. 7, 2018

(54) ACTIVE MATRIX ORGANIC LIGHT EMITTING DIODE ARRAY SUBSTRATE, FABRICATING METHOD, AND DISPLAY APPARATUS

(71) Applicant: BOE TECHNOLOGY GROUP CO., LTD, Beijing (CN)

(72) Inventors: Peng Cai, Beijing (CN); Youwei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/500,951

(22) PCT Filed: May 20, 2016

(86) PCT No.: PCT/CN2016/082891
§ 371 (c)(1),
(2) Date: Feb. 1, 2017

(87) PCT Pub. No.: WO2017/024851
PCT Pub. Date: Feb. 16, 2017

(65) Prior Publication Data
US 2017/0221762 A1 Aug. 3, 2017

(30) Foreign Application Priority Data
Aug. 11, 2015 (CN) .......................... 2015 1 0491363

(51) Int. Cl.
*H01L 21/00* (2006.01)
*H01L 21/77* (2017.01)
(Continued)

(52) U.S. Cl.
CPC .............. *H01L 21/77* (2013.01); *H01L 27/12* (2013.01); *H01L 27/32* (2013.01);
(Continued)

(58) Field of Classification Search
CPC ......... H01L 21/77; H01L 27/12; H01L 27/32; H01L 27/3202; H01L 27/3204; H01L 27/3225; H01L 27/3258
See application file for complete search history.

(56) References Cited

U.S. PATENT DOCUMENTS 8,592,809 B2 * 11/2013 Choi .................. H01L 27/1225
257/43
2004/0189192 A1 9/2004 Huang
2005/0093438 A1 5/2005 Chen

FOREIGN PATENT DOCUMENTS

| CN | 203013729 U | 6/2013 |
| CN | 104022139 A | 9/2014 |
| CN | 105097842 A | 11/2015 |

OTHER PUBLICATIONS

The World Intellectual Property Organization (WIPO) International Search Report for PCT/CN2016/082891 dated Aug. 22, 2016 p. 1-13.

(Continued)

*Primary Examiner* — Richard Booth
(74) *Attorney, Agent, or Firm* — Anova Law Group, PLLC

(57) ABSTRACT

In some embodiments of the disclosed subject matter provides an active matrix organic light emitting diode array substrate, comprising; multiple pixel units in an array on a base substrate, adjacent pixel units are separated by a pixel defining layer, each pixel unit comprises a thin film transistor and an organic light emitting diode; an insulating layer between a source/drain electrode layer of the thin film transistor and an electrode layer of the organic light emitting diode; the insulating layer includes a via hole therein, the electrode layer comprises a recess part connecting with the source/drain electrode layer in the via hole; and a filling layer on the recess part for preventing an organic light (Continued)

emitting layer of the organic light emitting diode being inside of the recess part, the pixel defining layer and an organic light emitting layer of the organic light emitting diode are overlaid on the filling layer.

20 Claims, 3 Drawing Sheets

(51) Int. Cl.
    *H01L 27/12*     (2006.01)
    *H01L 27/32*     (2006.01)

(52) U.S. Cl.
    CPC ...... *H01L 27/3202* (2013.01); *H01L 27/3204* (2013.01); *H01L 27/3225* (2013.01); *H01L 27/3258* (2013.01); *H01L 27/1255* (2013.01)

(56) References Cited

OTHER PUBLICATIONS

The State Intellectual Property Office of the People's Republic of China (SIPO) Office Action 1 for 201510491363.4 dated Jul. 13, 2017 14 Pages (including translation).

\* cited by examiner

ACTIVE MATRIX ORGANIC LIGHT EMITTING DIODE ARRAY SUBSTRATE, FABRICATING METHOD, AND DISPLAY APPARATUS

CROSS-REFERENCES TO RELATED APPLICATIONS

This application is a national phase entry under 35 U.S.C. § 371 of International Application No. PCT/CN2016/082891, filed on May 20, 2016, which claims priority to Chinese Patent Application No. 201510491363.4, filed on Aug. 11, 2015. The above enumerated patent applications are incorporated by reference herein in their entirety.

TECHNICAL FIELD

The disclosed subject matter generally relates to display technologies and, more particularly, relates to an active matrix organic light emitting diode (AMOLED) array substrate, a fabricating method thereof, and a related display apparatus.

BACKGROUND

Organic Light-Emitting Diode (OLED) display technology has been listed as a promising next-generation display technology due to many advantages, such as thin and light product, wide viewing angle, self-luminous feature, continuously adjustable light color, fast response, low energy consumption, low driving voltage, wide operating temperature range, simple production process, high luminous efficiency, flexible display, etc.

Depending on driving mode, OLED includes passive matrix organic light emitting diode (PMOLED) and active matrix organic light emitting diode (AMOLED). In AMOLED, an independent thin film transistor (TFT) is used for controlling each pixel, and each pixel can be continuously and independently driven for lighting. AMOLED has a low driving voltage and a long life time, which can be applied to large-size flat display area.

However, in conventional AMOLED display fabricating process, to satisfy high-resolution needs, and due to some errors in the fabricating process, the pixel defining layer may not completely cover the via holes in the planarization layer, the organic light-emitting layer of the organic light emitting diode may easily get into the via hole in the planarization layer and form a tip at a grade angle position of the anode. Because a point discharge may occur at this position, resulting in a breakdown of the organic light emitting unit. A large breakdown current and a high temperature can char and carbonize the organic light emitting layer, resulting in a direct overlap of the anode and the cathode, and causing a short circuit of the OLED device. This problem can result in the presence of defective pixel display dark spots, which affects the quality of display products.

Accordingly, it is desirable to provide an active matrix organic light emitting diode (AMOLED) array substrate, a fabricating method thereof, and a related display apparatus to at least partially alleviate one or more problems set forth above and to solve other problems in the art.

BRIEF SUMMARY

In accordance with some embodiments of the disclosed subject matter, an active matrix organic light emitting diode (AMOLED) array substrate, a fabricating method thereof, and a related display apparatus are provided.

An aspect of the present disclosure provides an active matrix organic light emitting diode (AMOLED) array substrate. The AMOLED array substrate comprises: multiple pixel units in an array on a base substrate, adjacent pixel units are separated by a pixel defining layer, each pixel unit comprises a thin film transistor and an organic light emitting diode; an insulating layer between a source/drain electrode layer of the thin film transistor and a first electrode layer of the organic light emitting diode; the insulating layer includes a via hole therein, the first electrode layer comprises a recess part connecting with the source/drain electrode layer in the via hole; and a filling layer on the recess part for preventing an organic light emitting layer of the organic light emitting diode being inside of the recess part in the via hole, the pixel defining layer and the organic light emitting layer of the organic light emitting diode are overlaid on the filling layer.

In some embodiments, the filling layer is protruded from a main body of the first electrode layer.

In some embodiments, the filling layer is extended to an outside of an edge of the recess part of the first electrode layer.

In some embodiments, the filling layer is extended to an outside of an edge of the recess part that is close to an edge of the main body of the first electrode layer.

In some embodiments, the filling layer is made of an organic material.

In some embodiments, the filling layer is made of an inorganic material.

In some embodiments, the insulating layer comprises a passivation layer on the source/drain electrode layer and a planarization layer on the passivation layer.

In some embodiments, the base substrate is a flexible substrate.

In some embodiments, the base substrate is a rigid substrate.

In some embodiments, the thin film transistor is a top-gate type thin film transistor.

In some embodiments, the thin film transistor is a bottom-gate type thin film transistor.

In some embodiments, each pixel unit further comprises a storage capacitor.

In some embodiments, the active matrix organic light emitting diode array substrate further comprises: an active layer of the thin film transistor, wherein the active layer comprises an ion-implanted part that is connected with the source/drain electrode layer; and a lower storage capacitor plate layer of the storage capacitor that is formed in a single process with the active layer.

In some embodiments, the active matrix organic light emitting diode array substrate further comprises: a gate electrode of the thin film transistor; and an upper storage capacitor plate layer of the storage capacitor that is formed in a single process with the gate electrode.

In some embodiments, the flexible substrate is made of at least one of polyimide, polycarbonate, polyacrylate, polyether imide, polyether sulfone, polyethylene terephthalate, and polyethylene naphthalate.

In some embodiments, the active matrix organic light emitting diode array substrate further comprises a second electrode layer on the pixel defining layer and the organic light emitting layer.

In some embodiments, the active matrix organic light emitting diode array substrate further comprises: a flexible encapsulation layer on the second electrode layer, wherein the flexible encapsulation layer comprises a plurality of alternatively arranged inorganic layers and organic layers.

Another aspect of the present disclosure provides a display apparatus, comprising a disclosed active matrix organic light emitting diode array substrate.

Another aspect of the present disclosure provides a method for fabricating an active matrix organic light emitting diode array substrate, comprising: forming an insulating layer including a via hole on a source/drain electrode layer of a thin film transistor; forming a first electrode layer of an organic light emitting diode on the insulating layer, wherein the first electrode layer has a recess part in the via hole, and the recess part of the first electrode layer is connected with the source/drain electrode layer through the via hole; forming a filling layer on the recess part of the first electrode layer; and forming a pixel defining layer and an organic light emitting layer of the organic light emitting diode that are overlaid on the filling layer; the filling layer prevents the organic light emitting layer of the organic light emitting diode being inside of the recess part in the via hole.

In some embodiments, the filling layer is protruded from a main body of the first electrode layer; and the filling layer is extended to an outside of an edge of the recess part of the first electrode layer.

Other aspects of the present disclosure can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

In accordance with various embodiments, the disclosed subject matter provides an active matrix organic light emitting diode (AMOLED) array substrate, a fabricating method thereof, and a related display apparatus.

In some embodiments, an active matrix organic light emitting diode array substrate is provided. The active matrix organic light emitting diode array substrate includes: a base substrate; a plurality of pixel units in an array on the base substrate, wherein: adjacent pixel units are separated by a pixel defining layer, and each pixel unit comprises a thin film transistor and an organic light emitting diode; an insulating layer between a source/drain electrode layer of the thin film transistor and a first electrode layer of the organic light emitting diode; wherein the insulating layer includes a via hole therein, the first electrode layer comprises a recess part in the via hole, and the recess part is connected with the source/drain electrode layer; and a filling layer on the recess part, wherein the pixel defining layer and an organic light emitting layer of the organic light emitting diode are overlaid on the filling layer.

Figure 1:
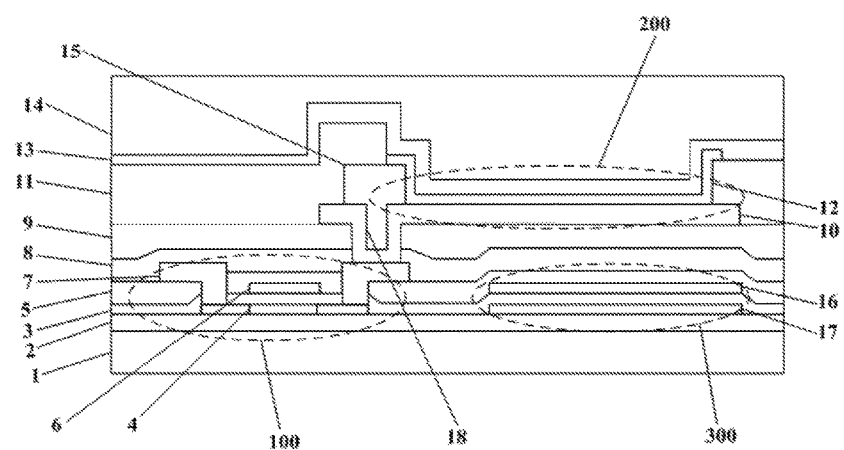
FIG. 1 is a schematic cross-sectional view diagram of an exemplary AMOLED array substrate in accordance with some embodiments of the disclosed subject matter.

Referring to FIG. 1, a schematic structural cross-sectional view diagram of an exemplary AMOLED array substrate is shown in accordance with some embodiments of the disclosed subject matter.

In some embodiments, the AMOLED array substrate can include base substrate 1 and multiple pixel units arranged in an array on base substrate 1. Adjacent pixel units can be separated by pixel defining layer 11. Each pixel unit can include a thin film transistor (TFT) 100 and an organic light emitting diode (OLED) 200.

In some embodiments, the AMOLED array substrate can further include an insulating layer between source/drain electrode layer 7 of TFT 100 and bottom electrode layer 10 of OLED 200. Source/drain electrode layer 7 is connected with bottom electrode layer 10 through a via hole in the insulating layer.

A recess part 18 of bottom electrode layer 10 of OLED 200, which may be on source/drain electrode layer 7, is formed in the via hole in the insulating layer. In some embodiments, the AMOLED array substrate can further include a filling layer 15 located in recess part 18 of bottom electrode layer 10 of OLED 200. Pixel defining layer 11 and organic light emitting layer 12 of OLED 200 cover filling layer 15.

In some embodiments, base substrate 1 can be a flexible substrate that is used in a flexible display apparatus. Base substrate 1 can be made of any flexible substrate material, such as polyimide, polycarbonate, polyacrylate, polyether imide, polyether sulfone, polyethylene terephthalate, polyethylene naphthalate, etc. In some embodiments, base substrate 1 can be a rigid substrate, such as a glass substrate, a resin substrate, etc.

In some embodiments, TFT 100 can be a top-gate type TFT or a bottom-gate type TFT. In the exemplary embodiment shown in FIG. 1, TFT 100 is a top-gate type TFT for illustration purposes.

In some embodiments, each pixel unit can further include a storage capacitor 300.

As illustrated in FIG. 1, the layer structure of the AMOLED array substrate can specifically include: based substrate 1, buffer layer 2, active layer 4, lower storage capacitor plate layer 17, gate insulating layer 3, gate electrode 6, upper storage capacitor plate layer 16, interlayer insulating layer 5, source/drain electrode layer 7, passivation layer 8, planarization layer 9, bottom electrode layer 10 of OLED 200, filling layer 15, pixel defining layer 11, organic light emitting layer 12 of OLED 200, top electrode layer 13 of OLED 200, encapsulation layer 14, etc.

In some embodiments, active layer 4 includes an ion-implanted part that is connected with source/drain electrode layer 7. In some embodiments, lower storage capacitor plate layer 17 and active layer are made of same material, and are formed in a same, single process. Lower storage capacitor plate layer 17 can also be formed by an ion implantation process.

In some embodiments, upper storage capacitor plate layer 16 and gate electrode 6 are made of same material, and are formed in a same, single process.

Filling layer 15 can be made of any suitable material, such as an organic material or an inorganic material, without limitation.

In some embodiments, top electrode layer 13 is located on pixel defining layer 11 and organic light emitting layer 12 of OLED 200.

Encapsulation layer 14 is on top electrode layer 13. When the AMOLED array substrate is used for a flexible display device, encapsulation layer 14 can be a flexible encapsulation layer. Specifically, encapsulation layer 14 can be a hybrid layer including multiple alternatively arranged inorganic layers and organic layers.

As illustrated in FIG. 1, the insulating layer can include passivation layer 8 on source/drain electrode layer 7 of TFT 100, and planarization layer 9 on passivation layer 8 to form the insulating layer. It should be noted that, the insulating layer can further include any suitable one or more layers.

In some embodiments, when bottom electrode layer 10 of OLED 200 is formed on the insulating layer including the planarization layer 9 and the passivation layer 8, the recess part 18 of bottom electrode layer 10 can be formed in a via hole in/through the insulating layer. So bottom electrode layer 10 can be connected with source/drain electrode layer 7 of TFT 100 through the via hole.

In an existing fabricating process, the pixel defining layer is formed directly above the recess part of the source/drain electrode layer. To satisfy the high-resolution requirement, an inclined edge of the pixel defining layer 11 is very close to an edge of the recess part 18 of the bottom electrode layer 10 in the via hole. Since the inevitable errors in the fabricating process, the pixel defining layer 11 may not completely cover the via holes in the planarization layer 9, a slit can be easily made between the inclined edge of the pixel defining layer 11 and the inclined edge of the recess part 18 of the bottom electrode layer 10 in the via hole. Therefore, the organic light emitting layer 12 of the OLED can extend into the recess part of the bottom electrode layer 10, form a tip at a grade angle position in the recess part of the bottom electrode layer 10. Because a point discharge may occur at this position in the via hole, resulting in a breakdown of the organic light emitting layer 12. A large breakdown current and a high temperature can char and carbonize the organic light-emitting layer 12, resulting in a direct overlap of the top electrode layer 13 and the bottom electrode layer 10, and causing a short circuit of the OLED device. This problem can result in the presence of defective pixel display dark spots, which affects the quality of display products.

Accordingly, in some embodiments of the disclosed subject matter, filling layer 15 can be formed on the recess part 18 of bottom electrode layer 10, and can effectively fill the recess part 18. Therefore, in the subsequent evaporating process, organic light emitting layer 12 does not enter the recess part 18, nor be in contact with bottom electrode layer 10. Compared with the existing fabricating process, the disclosed method can eliminate the defective pixel display dark spots, thereby improve the products quality.

In some embodiments, a top surface of filling layer 15 can in a same flat plane with a main body of bottom electrode layer 10. But preferably, as shown in FIG. 1, filling layer 15 can be protruded from the main body of bottom electrode layer 10 as an isolating and supporting structure. When applied to a flexible display device, this structure can effectively improve the bending resistance and impact resistance of the flexible display device.

Figure 2:
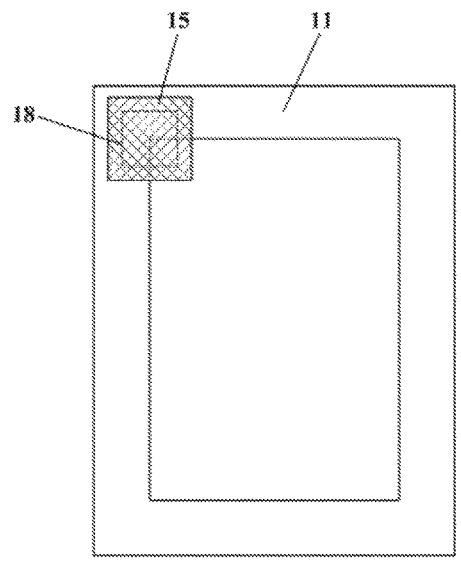
FIG. 2 is a schematic structural top view diagram including a recess part, a filling layer, and a pixel defining layer in accordance with some embodiments of the disclosed subject matter.

In some embodiments, as illustrated in a cross-sectional view in FIG. 1, and in a top view in FIG. 2, filling layer 15 can extend to the outside of all edges of recess part 18. In this case, filling layer 15 can seal the edges of recess part 18, and thereby prevent organic light emitting layer 12 from entering the recess part 18 to contact with bottom electrode layer 10.

Figure 3:
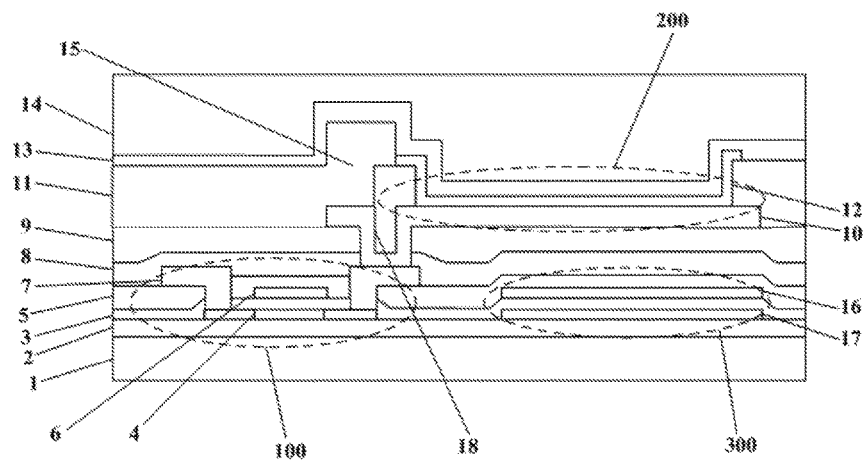
FIG. 3 is a schematic structural cross-sectional view diagram of another exemplary AMOLED array substrate in accordance with some other embodiments of the disclosed subject matter.
Figure 4:
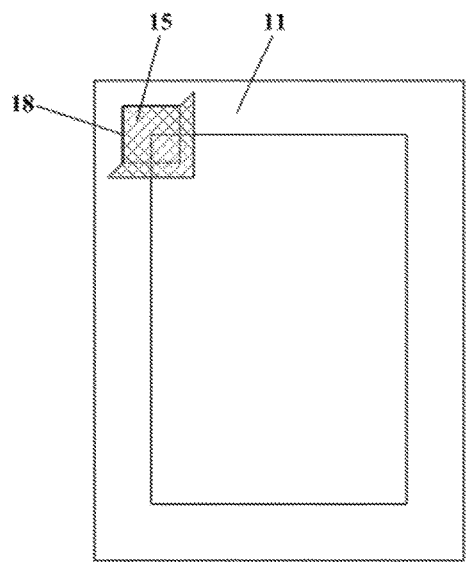
FIG. 4 is a schematic structural top view diagram including a recess part, a filling layer, and a pixel defining layer in accordance with some other embodiments of the disclosed subject matter.

In some other embodiments, as illustrated in a cross-sectional view in FIG. 3, and in a top view in FIG. 4, filling layer 15 can extend to the outside of the edges of recess part 18 that are close to the edges of the main body of bottom electrode layer 10. In this case, filling layer 15 can also prevent organic light emitting layer 12 from entering the recess part 18 to contact with bottom electrode layer 10.

It should be noted that, FIGS. 1-4 are merely schematic diagrams of the disclosed AMOLED array substrate according to various disclosed embodiments. The shape, the relative position, the thickness, and the scale of each layer in the structure of the AMOLED array substrate illustrated in FIGS. 1-4 are merely for illustrative purposes and are not intended to limit the scope of the present disclosure.

Figure 5:
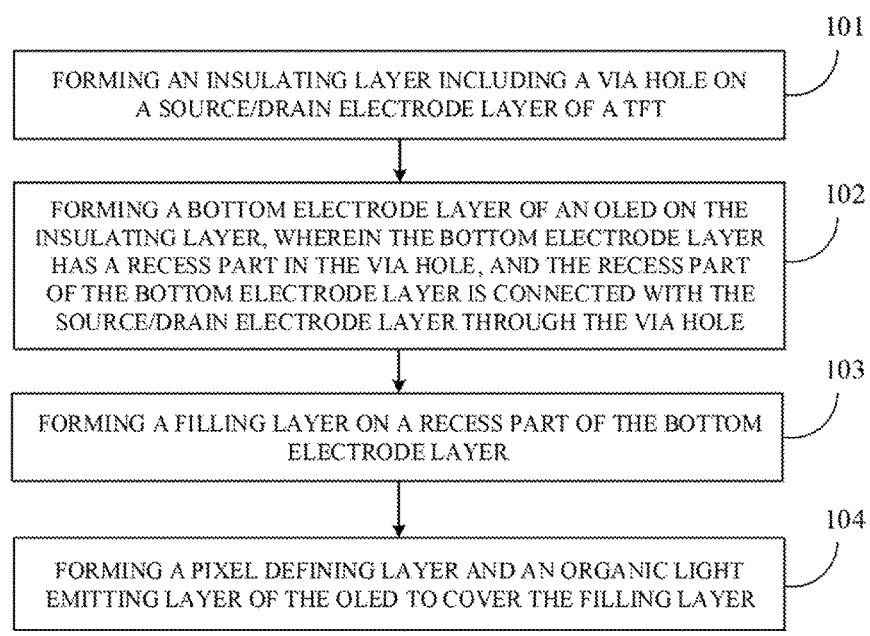
FIG. 5 is a flowchart of an exemplary method for fabricating an AMOLED array substrate in accordance with some embodiments of the disclosed subject matter.

Turning to FIG. 5, a flowchart of an exemplary fabricating method of a disclosed AMOLED array substrate is shown in accordance with some embodiments of the disclosed subject matter.

In some embodiments, the fabricating method can include:

Step 101: forming an insulating layer including a via hole on a source/drain electrode layer of a TFT.

Step 102: forming a bottom electrode layer of an OLED on the insulating layer. The bottom electrode layer has a recess part in the via hole, and the recess part of the bottom electrode layer is connected with the source/drain electrode layer through the via hole.

Step 103: forming a filling layer on a recess part of the bottom electrode layer.

Step 104: forming a pixel defining layer and an organic light emitting layer of the OLED to cover the filling layer.

In some embodiments, in an AMOLED array substrate fabricated by the method disclosed above, a filling layer can be formed on the recess part of the bottom electrode layer, and can effectively fill the recess part. Therefore, in the subsequent evaporating process, the organic light emitting layer does not enter the recess part to contact with bottom electrode layer. The disclosed method can eliminate the defective pixel display dark spots, thereby improve the products quality.

It should be noted that, the method for fabricating an AMOLED array substrate can further include any other suitable steps to form any other suitable layers or structures of the AMOLED array substrate that can realize different functions of the AMOLED array substrate.

Another aspect of the disclosed subject matter provides a related display apparatus that includes any one of AMOLED array substrates described above in connection with FIGS. 1-4. In some embodiments, the display apparatus can have improved quality due to elimination of the defective pixel display dark spots.

The display apparatus can include any suitable type of display device, such as a flat panel display device, or a flexible display device. Specific types of the display apparatus can include monitor, electronic paper, tablet computer, television, smart phone, smart tag, smart card, smart glasses, smart watch, digital photo frame, etc.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, an active matrix organic light emitting diode (AMOLED) array substrate, a fabricating method thereof, and a related display apparatus are provided.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. An active matrix organic light emitting diode array substrate, comprising:
    a base substrate;
    a plurality of pixel units in an array on the base substrate, wherein:
        adjacent pixel units are separated by a pixel defining layer, and
        each pixel unit comprises a thin film transistor and an organic light emitting diode;
        an insulating layer between a source/drain electrode layer of the thin film transistor and a first electrode layer of the organic light emitting diode;
    wherein:
        the insulating layer includes a via hole therein, the first electrode layer comprises a recess part in the via hole, and the recess part is connected with the source/drain electrode layer; and
        a filling layer on the recess part for preventing an organic light emitting layer of the organic light emitting diode being inside of the recess part in the via hole, wherein the pixel defining layer and the organic light emitting layer of the organic light emitting diode are overlaid on side and top surfaces of the filling layer.

2. The active matrix organic light emitting diode array substrate of claim 1, wherein the filling layer is protruded from a main body of the first electrode layer.

3. The active matrix organic light emitting diode array substrate of claim 2, wherein the filling layer is extended to an outside of an edge of the recess part of the first electrode layer.

4. The active matrix organic light emitting diode array substrate of claim 2, wherein the filling layer is extended to an outside of an edge of the recess part that is close to an edge of the main body of the first electrode layer.

5. The active matrix organic light emitting diode array substrate of claim 1, wherein the filling layer is made of an organic material.

6. The active matrix organic light emitting diode array substrate of claim 1, wherein the filling layer is made of an inorganic material.

7. The active matrix organic light emitting diode array substrate of claim 1, wherein the insulating layer comprises a passivation layer on the source/drain electrode layer and a planarization layer on the passivation layer.

8. The active matrix organic light emitting diode array substrate of claim 1, wherein the base substrate is a flexible substrate.

9. The active matrix organic light emitting diode array substrate of claim 1, wherein the thin film transistor is a top-gate type thin film transistor.

10. The active matrix organic light emitting diode array substrate of claim 1, wherein the thin film transistor is a bottom-gate type thin film transistor.

11. The active matrix organic light emitting diode array substrate of claim 1, wherein each pixel unit further comprises a storage capacitor.

12. The active matrix organic light emitting diode array substrate of claim 11, further comprising:
    an active layer of the thin film transistor, wherein the active layer comprises an ion-implanted part that is connected with the source/drain electrode layer; and
    a lower storage capacitor plate layer of the storage capacitor that is formed in a single process with the active layer.

13. The active matrix organic light emitting diode array substrate of claim 12, further comprising:
    a gate electrode of the thin film transistor; and
    an upper storage capacitor plate layer of the storage capacitor that is formed in a single process with the gate electrode.

14. The active matrix organic light emitting diode array substrate of claim 8, wherein the flexible substrate is made of at least one of polyimide, polycarbonate, polyacrylate, polyether imide, polyether sulfone, polyethylene terephthalate, and polyethylene naphthalate.

15. The active matrix organic light emitting diode array substrate of claim 8, further comprising a second electrode layer on the pixel defining layer and the organic light emitting layer.

16. The active matrix organic light emitting diode array substrate of claim 15, further comprising: a flexible encapsulation layer on the second electrode layer, wherein the flexible encapsulation layer comprises a plurality of alternatively arranged inorganic layers and organic layers.

17. A display apparatus, comprising an active matrix organic light emitting diode array substrate of claim 1.

18. A method for fabricating an active matrix organic light emitting diode array substrate, comprising:
    forming an insulating layer including a via hole on a source/drain electrode layer of a thin film transistor;
    forming a first electrode layer of an organic light emitting diode on the insulating layer, wherein the first electrode layer has a recess part in the via hole, and the recess part of the first electrode layer is connected with the source/drain electrode layer through the via hole;
    forming a filling layer on the recess part of the first electrode layer; and
    forming a pixel defining layer and an organic light emitting layer of the organic light emitting diode that are overlaid on side and top surfaces of the filling layer;

wherein the filling layer prevents the organic light emitting layer of the organic light emitting diode being inside of the recess part in the via hole.

19. The method for fabricating an active matrix organic light emitting diode array substrate of claim 18, wherein:
the filling layer is protruded from a main body of the first electrode layer; and
the filling layer is extended to an outside of an edge of the recess part of the first electrode layer.

20. The active matrix organic light emitting diode array substrate of claim 1, wherein the pixel defining layer is overlaid on a portion of the top surface of the filing layer, and the organic light emitting layer of the organic light emitting diode is overlaid on another portion of the top surface of the filing layer.

* * * * *